(12) United States Patent
Shudo et al.

(10) Patent No.: US 6,590,391 B1
(45) Date of Patent: Jul. 8, 2003

(54) MRI DIAGNOSIS APPARATUS WITH AN INTERGRATED CABINET THAT IS MECHANICALLY AND ELECTRICALLY CONNECTED TO THE ELECTRICALLY CONDUCTIVE SHIELD OF THE SHIELD ROOM IN WHICH THE MR MEASUREMENT SYSTEM IS ARRANGED

(75) Inventors: Tsuyoshi Shudo, Hitachinaka (JP); Munetaka Tsuda, Mito (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/391,072

(22) Filed: Sep. 16, 1999

(30) Foreign Application Priority Data

Sep. 17, 1998 (JP) .......................... 10-263326

(51) Int. Cl.$^7$ ................................ G01V 3/00
(52) U.S. Cl. ................ 324/318; 324/322; 324/320
(58) Field of Search ............... 324/309, 320, 324/307, 318, 314, 322

(56) References Cited

U.S. PATENT DOCUMENTS 4,651,099 A * 3/1987 Vinegar et al. ............. 324/320
4,667,159 A * 5/1987 Hodsoll, Jr. et al. ........ 324/309
4,992,736 A * 2/1991 Stormont et al. ........... 324/309
5,933,450 A * 8/1999 Lakshminarayanan et al. .. 382/260
5,933,540 A * 8/1999 Lakshminarayanan et al. .. 382/260
6,198,285 B1 * 3/2001 Kormos et al. ............. 324/318
6,229,311 B1 * 5/2001 Abenaim .................... 324/322

FOREIGN PATENT DOCUMENTS

DE       0210525      *  7/1986
EP       0210525 A    *  7/1986

* cited by examiner

*Primary Examiner*—Edward Lefkowitz
*Assistant Examiner*—Tiffany A. Fetzner
(74) *Attorney, Agent, or Firm*—Antonelli, Terry, Stout, & Kraus, LLP

(57) ABSTRACT

A line filter unit and a gradient magnetic field power supply placed in a shield room are contained in one cabinet to integrate them into one unit, and the integrated cabinet unit is attached on a wall of the shield room, and the cabinet unit is electrically integrated with a radio frequency shield conductor in the radio frequency shield room. Further, a signal amplifier and an electric power amplifier may be contained in the integrated cabinet unit.

41 Claims, 5 Drawing Sheets

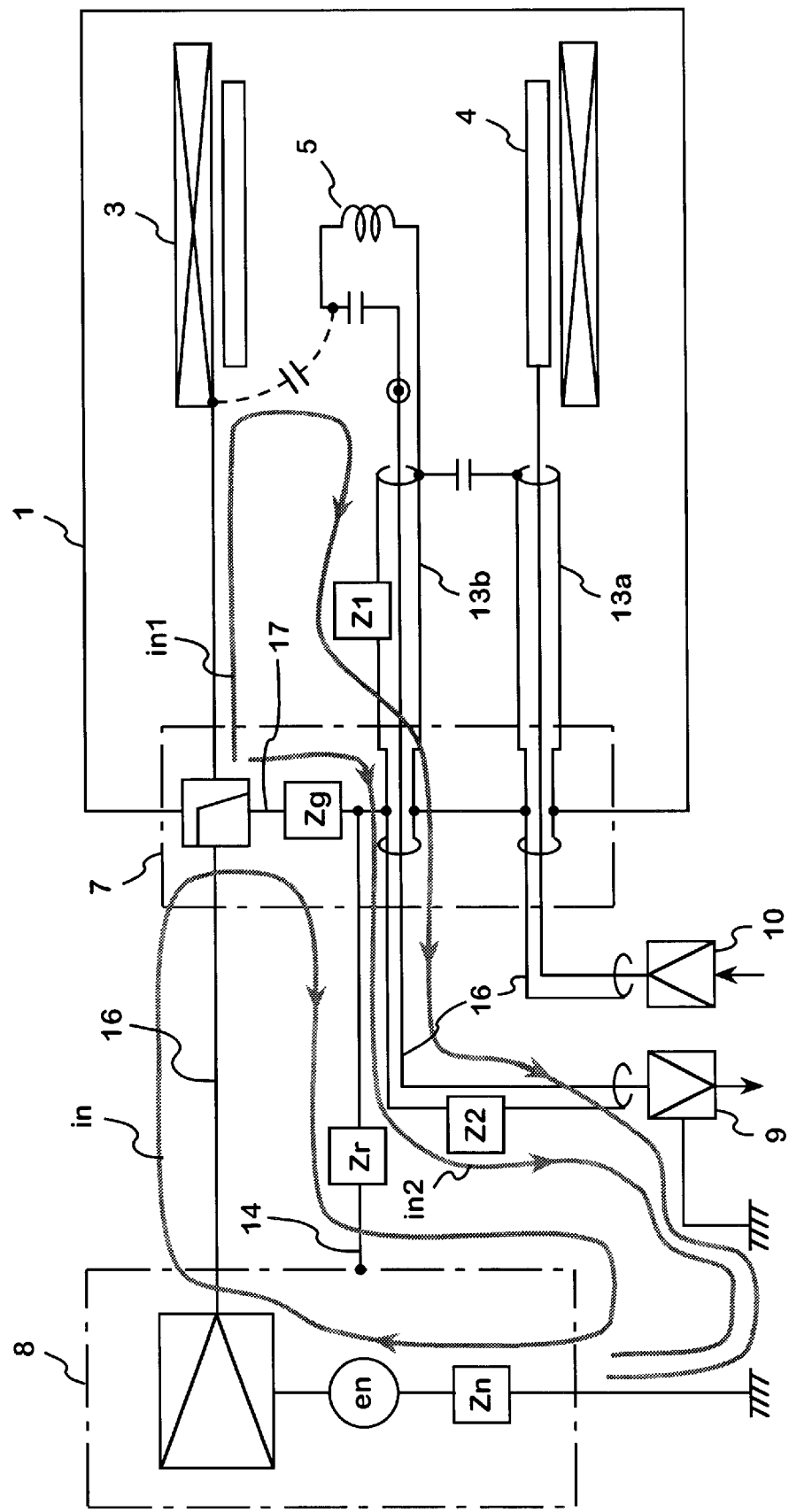

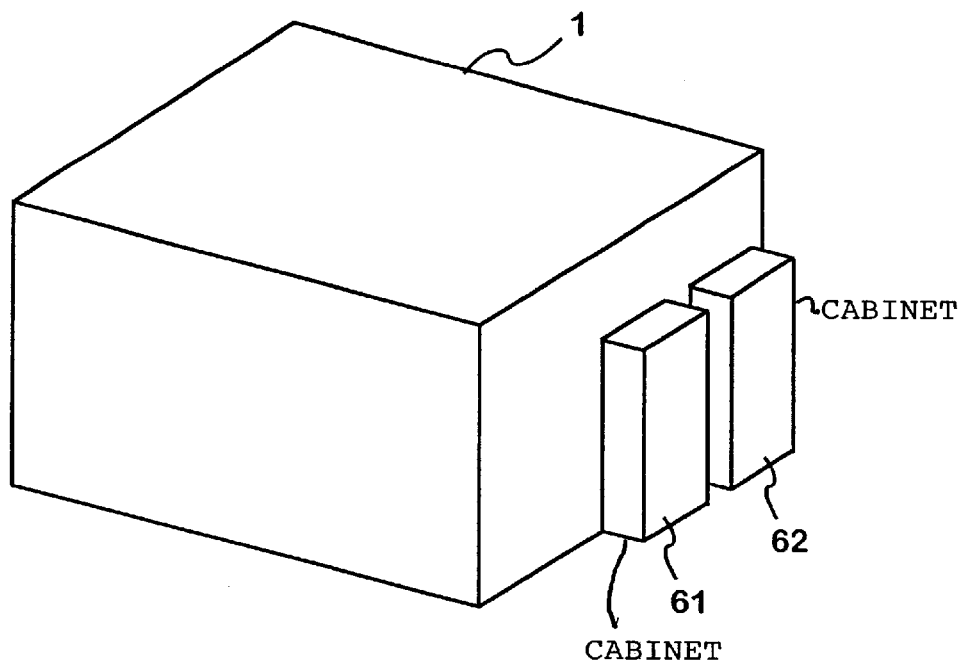

MRI DIAGNOSIS APPARATUS WITH AN INTERGRATED CABINET THAT IS MECHANICALLY AND ELECTRICALLY CONNECTED TO THE ELECTRICALLY CONDUCTIVE SHIELD OF THE SHIELD ROOM IN WHICH THE MR MEASUREMENT SYSTEM IS ARRANGED

BACKGROUND OF THE INVENTION

The present invention relates to a nuclear magnetic resonance diagnosis apparatus; and, more particularly, the invention relates to a nuclear magnetic resonance diagnosis apparatus which is suitable for diagnosing a condition of an object to be inspected by obtaining an image and/or a nuclear magnetic spectrum of the object to be inspected using a nuclear magnetic resonance phenomenon.

In a conventional nuclear magnetic resonance diagnosis apparatus, a measurement system, including a magnet generating a static magnetic field, a gradient magnetic field coil, an irradiation coil generating a radio frequency magnetic field and a receiving coil for receiving a nuclear magnetic resonant signal from an object to be inspected, is installed in an electromagnetic shield room in order to shield radio frequency noises generated inside and outside the nuclear magnetic resonance diagnosis apparatus. A gradient magnetic field power supply for driving the gradient magnetic coil, a power amplifier for the irradiation coil and a signal amplifier for amplifying the nuclear magnetic resonance signal detected by the receiving coil are contained in individual cabinets, or in an integrated cabinet, and are connected to the gradient magnetic field coil, the irradiation coil and the receiving coil in the shield room through line filter units (line noise removing means) provided on the wall surface of the shield room, respectively.

The gradient magnetic field power supply, the power amplifier and the signal amplifier are connected to line filter units through respective cables, and the ground points of the cabinets or the constituent circuits are connected to a system ground common to the shield room. A nuclear magnetic resonance diagnosis apparatus of this type is described, for example, in Catalogue No. CP-E094 "AIRIS" of Hitachi Medical Corporation and Catalogue No. CP-E090 "STRATIS" of Hitachi Medical Corporation.

The shield room and the line filter unit block remove radio frequency noises existing in the surrounding area and radio frequency noises generated by the nuclear magnetic resonance diagnosis apparatus itself outside the shield room so that the noises are not received by the measurement system in the shield room.

On the other hand, in recent years, the imaging technology in the field of nuclear magnetic resonance diagnosis has become increasingly faster in measuring speed and has been enhanced in function; and, accordingly, a power supply of a switching type capable of coping with a high gradient magnetic field and a high slew rate (for instance, above 100 T/m/s) has been used as the gradient magnetic field power supply. One disadvantage of a power supply of the switching type is that it generates wide band radio frequency noises, and there are some cases in which the radio frequency noises can not be sufficiently removed only by provision of the shield room and the line filter unit described above.

Since the shielding ratio of the shield room and the line filter unit is 60 dB to 80 dB (1/1000 to 1/10000), the noise becomes A/1000 to A/10000, where A is the intensity of the generated noise of the gradient magnetic field power supply. Therefore, the effect on the NMR signal can be neglected. However, since the shielding performance of the shield room and the line filter unit is the same even if the generated noise of the gradient magnetic field power supply is increased (for example, by as much as 10 times) due to high speed measurement, the noise becomes 10A/1000 to 10A/10000. Therefore, the effect of this noise on the NMR signal can not be neglected. Further, when the attenuation ratio of the line filter is increased in a case of using EPI (echo planer imaging) or the like, which can switch the operation of the gradient magnetic field power supply at a high speed, the switching waveform tends to lose its shape, changing from a pulse shape to a wave shape, so that the required imaging function can not be attained. This is also one of the reasons why the noise can not be removed.

Particularly, since the condition for arranging the units, such as the gradient magnetic field power supply, the radio frequency power amplifier, the radio frequency signal amplifier, and so on, varies depending on the place where the nuclear magnetic resonance diagnosis apparatus is installed, there are some cases in which the noises, particularly the noise of the gradient magnetic field power supply, can not be removed depending on the installation environment.

As another method of removing the radio frequency noise from the gradient magnetic field power supply, there is a method in which a filter of a low pass type having a high attenuation ratio for the measurement band of the nuclear magnetic resonance signal is added just near the output position, in addition to the line filter unit in the shield room. However, in this case, a higher peak electric power is necessary when an inductive type of filter is employed. When a capacitance type of filter is employed, there is a problem in that a high response characteristic having a rapid rise to a pulse output current is degraded; and, accordingly, it becomes difficult to obtain a flat top waveform having a good flatness for suppressing ringing at the rising portion.

SUMMARY OF THE INVENTION

An object of the present invention is to provide a nuclear magnetic resonance diagnosis apparatus which is suitable for reducing the effect of radio frequency noises on the nuclear magnetic resonance signal.

Another object of the present invention is to provide a nuclear magnetic resonance diagnosis apparatus which is suitable for removing the effect of radio frequency noises on the nuclear magnetic resonance signal without affecting the output response characteristic and the required electric power of the gradient magnetic field power supply.

According to the present invention, a nuclear magnetic resonance diagnosis apparatus is provided which comprises: a measurement system, including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected; a gradient magnetic field power supply for driving the gradient magnetic field coil; a signal processing system for reconstructing a sectional image of the object to be inspected based on the nuclear magnetic resonance signal; an electromagnetic shield room in which the measurement system is arranged; a line noise filter connected between the gradient magnetic field coil and the gradient magnetic power supply; and a first cabinet in which the gradient magnetic field power supply and the line noise filter are contained, the first cabinet being mechanically and electrically connected to the shield room.

According to another aspect of the present invention, the nuclear magnetic resonance diagnosis apparatus further comprises a radio frequency amplifier for supplying a current to the irradiation coil; a signal amplifier for amplifying the nuclear magnetic resonance signal; and a second cabinet in which the radio frequency amplifier and said signal amplifier are contained, the second cabinet being mechanically and electrically connected to the shield room.

According to an additional aspect of the present invention, a nuclear magnetic resonance diagnosis apparatus is provided which comprises: a measurement system, including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected; a gradient magnetic field power supply for driving the gradient magnetic field coil; a radio frequency amplifier for supplying a current to the irradiation coil; a signal amplifier for amplifying the nuclear magnetic resonance signal; a preamplifier connected between the receiving coil and the signal amplifier; an electric power supply for the preamplifier; a signal processing system for reconstructing a sectional image of the object to be inspected based on the nuclear magnetic resonance signal; an electromagnetic shield room in which the measurement system is arranged; a line noise filter connected between the gradient magnetic field coil and the gradient magnetic field power supply; and a line noise filter connected between the preamplifier and its electric power supply; a first cabinet in which the gradient magnetic field power supply and the line noise filter for the gradient magnetic field are contained, the first cabinet being mechanically and electrically connected to the shield room; and a second cabinet in which the radio frequency amplifier, the signal amplifier, the preamplifier and the line noise filter therefor are contained, the second cabinet being mechanically and electrically connected to the shield room; the gradient magnetic field power supply and the line noise filter for the gradient magnetic field being connected to each other so as to reduce the distance therebetween, and/or the preamplifier and the electric power supply for the preamplifier being connected to each other so as to reduce the distance therebetween.

According to yet another aspect of the present invention, a nuclear magnetic resonance diagnosis apparatus is provided which comprises: a measurement system, including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected; a gradient magnetic field power supply for driving the gradient magnetic field coil; a radio frequency amplifier for supplying a current to the irradiation coil; a signal amplifier for amplifying the nuclear magnetic resonance signal; a preamplifier connected between the receiving coil and the signal amplifier; an electric power supply for the preamplifier; a signal processing system for reconstructing a sectional image of the object to be inspected based on the nuclear magnetic resonance signal; an electromagnetic shield room in which the measurement system is arranged; a line noise filter for the gradient magnetic field connected between the gradient magnetic field coil and the gradient magnetic field power supply; and a line noise filter for the preamplifier connected between the preamplifier and its electric power supply; the gradient magnetic field power supply and the line noise filter for the gradient magnetic field being connected to each other so as to be prevented from being spaced apart from each other, and/or the preamplifier and the electric power supply therefor being connected to each other so as to be prevented from being spaced apart from each other.

According to a further aspect of the present invention, a nuclear magnetic resonance diagnosis apparatus comprises: a measurement system, including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected; a gradient magnetic field power supply for driving the gradient magnetic field coil; a radio frequency amplifier for supplying a current to the irradiation coil; a signal amplifier for the nuclear magnetic resonance signal; a preamplifier connected between the receiving coil and the signal amplifier; an electric power supply for the preamplifier; a signal processing system for reconstructing a sectional image of the object to be inspected based on the nuclear magnetic resonance signal; an electromagnetic shield room in which the measurement system is arranged; a line noise filter connected between the gradient magnetic.field coil and the gradient magnetic field power supply; and a line noise filter connected between the preamplifier and its electric power supply; the gradient magnetic field power supply and the line noise filter for the gradient magnetic field being connected to each other so that a connection line therebetween becomes substantially zero in impedance, and/or the preamplifier and the electric power supply therefor being connected to each other so that a connection line therebetween becomes substantially zero in impedance.

According to a further additional aspect of the present invention, a nuclear magnetic resonance diagnosis apparatus is provided which comprises: a measurement system, including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected; a gradient magnetic field power supply for driving the gradient magnetic field coil; a radio frequency amplifier for supplying a current to the irradiation coil; a signal processing system for reconstructing a sectional image of the object to be inspected based on the nuclear magnetic resonance signal; an electromagnetic shield room in which the measurement system is arranged; a line noise filter connected between the gradient magnetic field coil and the gradient magnetic power supply; and a system ground to which the gradient magnetic field power supply, the signal amplifier, the radio frequency amplifier and the line noise filter are connected.

According to still another aspect of the present invention, a nuclear magnetic resonance diagnosis apparatus is provided which comprises: a measurement system, including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected; a gradient magnetic field power supply for driving the gradient magnetic field coil; a signal processing system for reconstructing a sectional image of the object to be inspected based on the nuclear magnetic resonance signal; an electromagnetic shield room in which the measurement system is arranged; and a line noise filter connected between the gradient magnetic field coil and the gradient magnetic power supply; the gradient magnetic field power supply and the line noise filter being connected to each other so that a noise voltage generated from the gradient magnetic field power supply and mixed in the nuclear magnetic resonance signal is substantially zero.

Other objects and features of the present invention will become more apparent from the description of the preferred embodiments of the present invention taken in connection with the accompanying drawings.

BRIEF DESCRIPTION OF DRAWINGS

FIG. 4 is a is a diagram showing a radio frequency noise removing effect by the present invention.

FIG. 5 is a perspective view showing the outer appearance of a shield room in another embodiment of a nuclear magnetic resonance diagnosis apparatus in accordance with the present invention.

DESCRIPTION OF THE PREFERRED EMBODIMENTS

Figure 1:
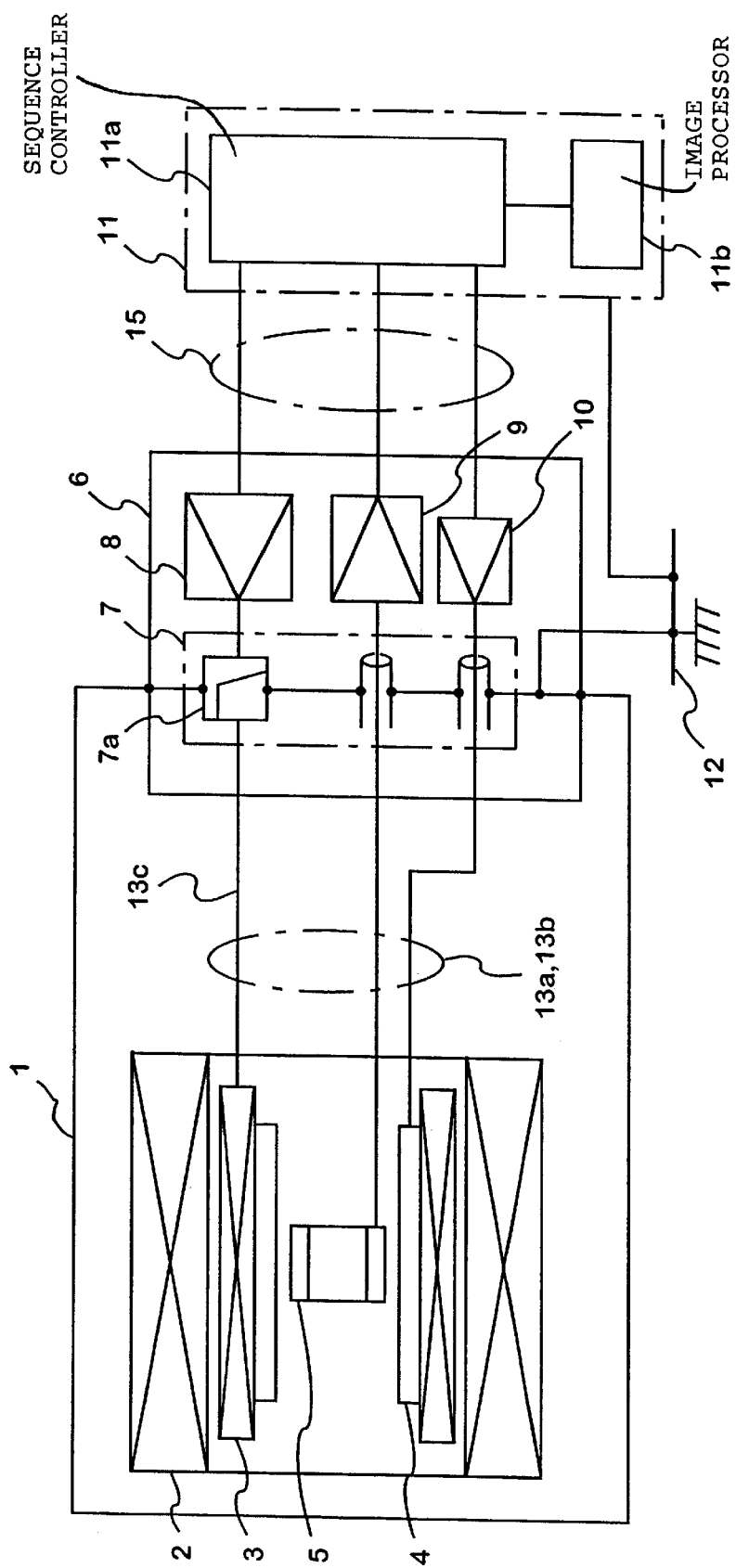
FIG. 1 is a block diagram showing an embodiment of a nuclear magnetic resonance diagnosis apparatus in accordance with the present invention.

Referring to FIG. 1, the nuclear magnetic resonance diagnosis apparatus mainly comprises a measurement system for causing nuclei constituting the tissue an object, specifically e.g. a living body, to produce nuclear magnetic resonance and for receiving a nuclear magnetic resonance signal generated from the object to be inspected; a radio frequency electric power amplifier for supplying a current to an irradiation coil of one constitutional element of the measurement system; a signal and electric power amplifier system including a gradient magnetic field drive power supply of one constitutional element of the measurement system and a signal amplifier for amplifying the nuclear magnetic resonance signal from the receiving coil of one constitutional element of the measurement system; and a signal processing system for controlling the drive of the signal and electric power amplifier system and for forming a sectional image of the object to be inspected based on the received nuclear magnetic resonance signal.

The measurement system comprises a magnet 2 for generating a static magnetic field; three sets of gradient magnetic field coils 3 for generating gradient magnetic fields in X, Y and Z-axis directions intersecting at right angles with one another, respectively; an irradiation coil 4 for generating a radio frequency magnetic field; and a receiving coil 5 for receiving a nuclear magnetic resonance signal of a radio frequency magnetic field generated from the object to be inspected, wherein the magnet 2, the gradient magnetic field coils 3 and the irradiation coil 4 are coaxially arranged to form a gantry. The elements which make up the measurement system are placed in a radio frequency shield room 1 for shielding the system from radio frequency noises from the outside.

Figure 2:
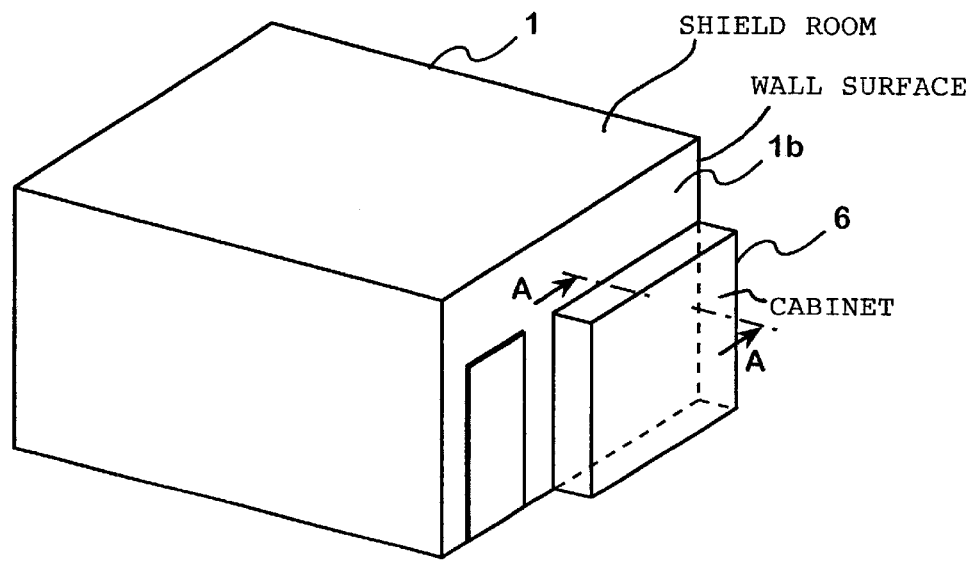
FIG. 2 is a perspective view showing the outer appearance of a shield room for the apparatus of FIG. 1.
Figure 3:
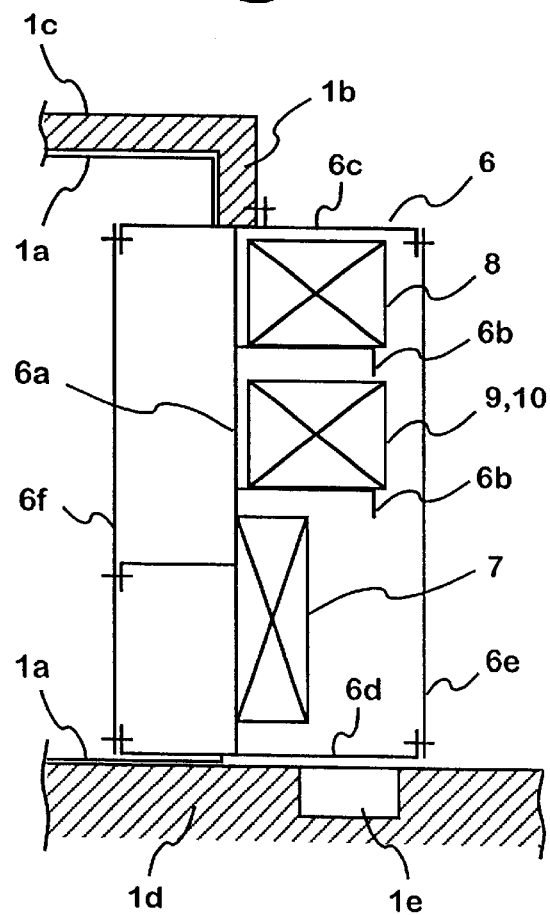
FIG. 3 is a cross-sectional view showing the shield room as seen on the plane of the line A—A of FIG. 2.

The shield room 1 has a radio frequency shield, that is, an electric conductive plate or an electric conductive film 1a on whole inner wall surface thereof in order to shield radio frequency electromagnetic waves, as seen in FIG. 3, and the conductive plate or the conductive film 1a is connected to a system ground 12, as shown in FIG. 1, in order to prevent electric shock to a human body. Further, as shown in FIGS. 1–3, a cabinet 6 is electrically and mechanically connected to a part of the wall surface of the shield room 1. As shown in FIGS. 1 and 3, the cabinet 6 is electrically and mechanically connected to a part of the wall surface in a unit with the electric conductive plate or electric conductive film and includes a line filter unit 7 having a line filter 1a, as shown in FIG. 1. Further, each element of the signal and electric power amplifier system and the other relating mechanisms are contained in the a cabinet 6 to form an integrated unit. The cabinet 6 may be constructed together with the shield room 1 in a unit, or the cabinet 6 may be constructed separately from the shield room 1 and attached to the wall surface of the shield room to be formed in a unit therewith.

The signal and electric power amplifier system comprises a gradient magnetic field power supply 8 for supplying current to each of the gradient magnetic field coils 3, a signal amplifier 9 for amplifying a signal received by the receiving coil 5 and an electric power amplifier (radio frequency amplifier) 10 for supplying surrent to the irradiation coil 4, and the signal amplifier 9 and the electric power amplifier 10 are connected to the receiving coil 5 and the irradiation coil 4 through coaxial cables 13a and 13b, respectively. Further, the gradient magnetic field power supplyl 8 is connected to the gradient magnetic field coil 3 through the line filter 7a and an output line 13c. The elements of the signal and electric power amplifier system are contained and fixed in the cabinet 6 integrally together with the line filter unit 7, as described above.

FIG. 3 shows the inner structure of a part of the cabinet unit, including the cabinet 6 of the wall surface attaching type. The cabinet 6 comprises a ceiling plate 6c and a bottom plate 6d parallel to a ceiling 1c of the shield room 1; side plates (not shown) connecting the ceiling plate 6c and the bottom plate 6d; a partition wall 6a parallel to a wall surface 1b, the partition wall 6a being formed so as to divide the space enclosed by the ceiling plate 6c, the bottom plate 6d and the both side plates; and a detachable front plate 6e and a rear plate 6f, the front plate and the rear plate being fixed to the conductive plate or conductive film 1a so that the front plate side of the cabinet 6 is outside the shield room 1 and the rear plate side of the cabinet 6 is inside the shield room 1. The shield room 1 also includes a floor plate 1d.

Among the plates which form the cabinet 6, the ceiling plate 6c, the bottom plate 6d, the side plates and the partition plate 6a are made of the same radio frequency shield material (electric conductor) as that of the conductive plate or the conductive film 1a, and these elements are electrically connected to the conductive plate or conductive film 1a of the radio frequency shield room 1 at the surfaces in contact with the wall surface of the shield room. Further, the partition wall 6a is electrically connected to the system ground 12, and thereby the shield room 1 and the cabinet 6 of the wall attaching type are connected to the system ground 12 which is shown in FIG. 1. Although, in the embodiment shown by the figures, the ceiling plate 6c, the bottom plate 6d, the side plates and the partition plate 6a are made of a material which is capable of shielding electromagnetic waves, the whole cabinet 6 may be made of a material capable of radio frequency shielding, or the partition plate 6a and two plates surrounding the partition plate may be made of a material capable of radio frequency shielding and be electrically connected to the shield room at joined surfaces.

Further, although in the embodiment shown by the figures, a part of the cabinet 6 is arranged so as to be inside the shield room, the whole cabinet 6 may be placed inside the shield room or outside the shield room.

The line filter unit 7 is directly attached onto the partition plate 6a of the cabinet 6 and is electrically connected with surface contact. On the other hand, the gradient magnetic field power supply 8, the signal amplifier 9 and the electric power amplifier 10 are mounted on and fixed to racks 6b integrally provided on the partition wall 6a or directly fixed to the partition wall 6a, and the grand lines are connected to the partition wall 6a with electric low impedance through the cases, respectively. Thereby, the cabinet 6, the line filter unit 7 and the elements of the signal and electric power amplifier system are connected to the conductor plate or conductor film 1a of the shield room and are also connected to the system ground 12.

Cables connecting these units are contained in a wire pit 1e formed on a floor 1d on which the apparatus is installed.

The signal processing system comprises an image processing unit 11 composed of a sequence controller 11a for controlling the gradient magnetic field power supply 8, the signal amplifier 9 and the electric power amplifier 10 according to a predetermined sequence, and an image processor 11b for performing processing, such as signal processing, Fourier transform processing and the like, on the nuclear magnetic resonance signal received by the receiving coil 5 and for reconstructing an image. The magnetic field power supply 8, the signal amplifier 9 and the electric power amplifier 10 are connected to the image processing unit 11 through a control line 15. The image processing unit 11 is placed in an operating room near an exposure room, together with an input unit, not shown, for inputting an exposure condition and a display unit, not shown, for displaying the reconstructed image. The image processing unit 12 is connected to the system ground 12 similarly to the shield room 1.

The principle employed by the present invention for preventing the effect of radio frequency noise in a nuclear magnetic resonance diagnosis apparatus will be described below, with reference to FIG. 4.

FIG. 4 is a diagram showing the process in which the radio frequency noise generated from the gradient magnetic power supply 8 is mixed in the signal line. Here, the gradient magnetic field power supply 8, the signal amplifier 9 and the electric power amplifier 10 are connected to the line filter unit 7 through coaxial cables 16, and the line filter 7 is connected to the system ground through a return line (ground line) 14.

In this case, part of the noise of the gradient magnetic field power supply 8 is transmitted in the coaxial cable 16 and returned to the gradient magnetic field power supply 8 of the noise source "en" from the return line 14 (a circuit common line in common with the ground line) through the line filter 7. When the line impedance Zr of the return line 14 is high, a loop is formed. That is, part of the noise current "in" passes through the filter 7 and is superposed at the irradiation coil 4 or the receiving coil 5 with electrostatic coupling or electromagnetic coupling through the gradient magnetic field coil 3, and then is returned to the noise source "en" of the gradient magnetic field power supply 8 from the signal amplifier 9 mainly through the ground lines of the coaxial cables 13a, 13b of the signal line as a noise current in1. On the other hand, another main return path of a noise current is provided wherein the noise current is transmitted from the common line (the partition plate of the filter) 17 of the line filter 7 to the signal amplifier 9 through the ground line of the coaxial cable 16 of the received signal line, and is returned to the noise source "en" of the gradient magnetic field power supply 8 from the signal amplifier 9. Zn is a value of impedance of the ground line coupled to the noise source "en". Letting the noise currents in these return paths be in1, in2, the noise currents in1, in2 can be expressed by the following equations (1) and (2).

$$In1 = in\{Zg/(Zg+Z1)\} \quad (1)$$

$$In2 = in\{Zg/(Zg+Z2)\} \quad (2)$$

where Zg is a value of impedance of the common line 17, Zr is a value of line path impedance of the return line 14, and Z1 and Z2 are values of the line path impedance of the coaxial cables 13 and 16, respectively.

Therefore, the noise voltage eni, which is increased by being converted to a cross-mode by the input of the signal amplifier 9, can be expressed by Equation (3).

$$Eni = in\{Z1[Zg/(Zg+Z1)] + Z2[Zr/(Zr+Z2)]\} \quad (3)$$

It can be understood from the above equation (3) that the noise voltage eni mixed in the received signal can be set to zero or minimized by setting the line path impedance Zr of the return line 14 to zero or by minimizing it, or by setting the impedance Zg of the common line 17 of the line filter 7 to zero or by minimizing it.

In the nuclear magnetic resonance diagnosis apparatus according to the present invention, since the length of the noise current return line 14 is minimized by confining the noise source of the gradient magnetic field power supply 8 in the cabinet 6 and integrating it together with the line filter unit 7, the line path impedance Zr becomes nearly zero, and, consequently, the noise voltage eni can be minimized. Thereby, it is possible to obtain a high SN image.

Although it has been described above that the gradient magnetic field power supply 8 is a radio frequency noise source, radio frequency noise generated by the signal amplifier 9 and the electric power amplifier 10 also can be expected to be similarly reduced. That is, since the impedance Z2 of the coaxial cable 16 of the signal amplifier 9 and the impedance of the coaxial cable 16 of the electric power amplifier 10 can be reduced in a manner similar to that used for reducing the impedance Zr of the return line 14 in the gradient magnetic field power supply 8, the noise voltage in the input of the signal amplifier 9 can be minimized.

As another embodiment in accordance with the present invention, an apparatus will be described in which the elements of the signal and electric power amplifier system are divisionally contained in separate cabinets, as seen in FIG. 5. The nuclear magnetic resonance diagnosis apparatus of this embodiment has a structure in which two cabinets 61, 62 are integrally formed with the shield room 1 in a unit. The structure of each of the cabinets 61, 62 is the same as the embodiment shown in FIG. 1 to FIG. 3, and the cabinets 61, 62 and the partition walls are electrically and mechanically connected to the conductive plate or conductive film 1a of the shield room 1 and are connected to the system ground. In this embodiment, the gradient magnetic field power supply 8 and the related line filter unit 7a are contained in one cabinet 61 to form one unit, and the signal amplifier 9 and the electric power amplifier 10 and the related line filter units are contained in the other cabinet 62 to form one unit.

Figure 6A:
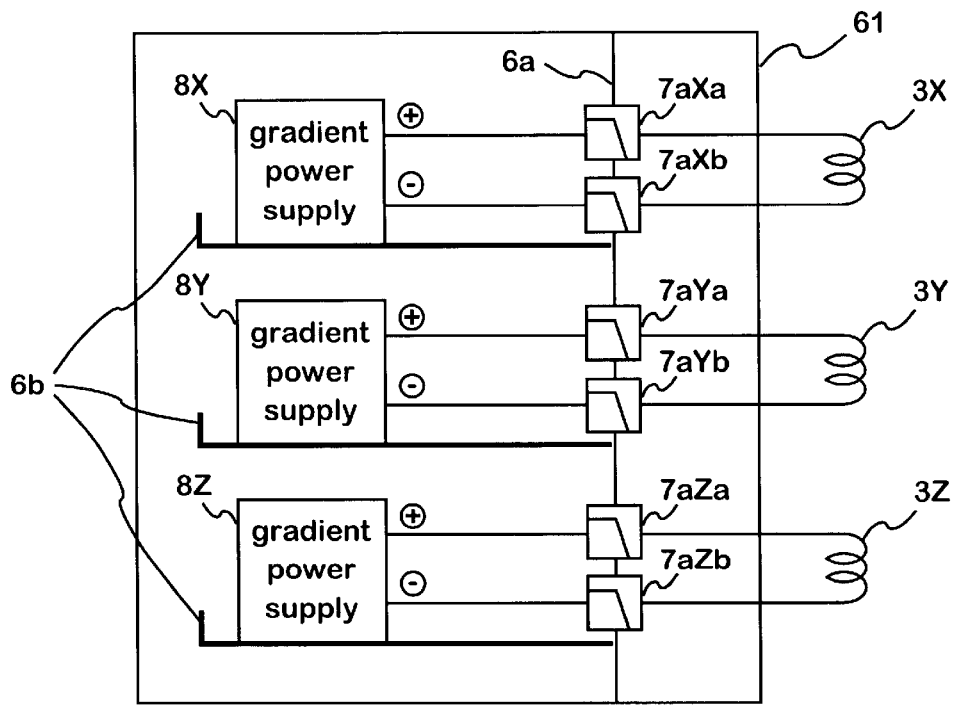
FIG. 6A and FIG. 6B are schematic diagrams showing the inside of the respective cabinet units shown in FIG. 5.
Figure 6B:
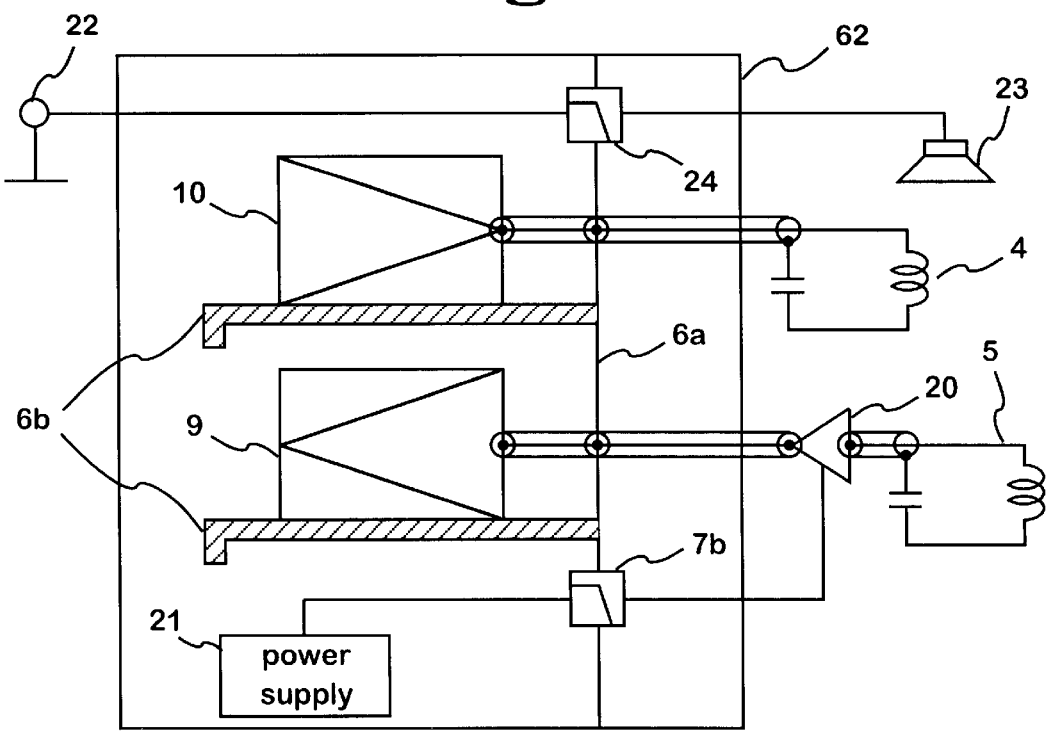

FIG. 6A is a diagram of the inner portion of a cabinet unit 61 of FIG. 5, and FIG. 6B is a diagram of the inner portion of a cabinet unit 62 of FIG. 5. The gradient magnetic field power supplies 8X, 8Y and 8Z for the X-, Y- and Z-axis gradient magnetic field coils 3X, 3Y and 3Z and the line filters 7aXa, 7aXb; 7aYa, 7aYb and 7aZa, 7aZb connected between the gradient magnetic field power supplies and the gradient magnetic field coils 3X, 3Y and 3Z are arranged in the cabinet 61, and the line filters are attached to the partition wall 6a. The gradient magnetic field power supplies 8X, 8Y and 8Z are mounted on and fixed to the racks 6b attached to the partition wall 6a. Further, the radio frequency amplifier (the electric power amplifier) 10, which is connected to the irradiation coil 4 through a coaxial cable, and the signal amplifier 9, which is connected to the receiving coil 5 through a coaxial cable, the preamplifier 20 and another coaxial cable, as well as the electric power supply 21 of the preamplifier and the line filter 7b, which is connected between the electric power supply and the preamplifier 20, are contained in the cabinet 62. The line filter 7b is attached on the partition wall 6a, and the signal amplifier 9 and the radio frequency amplifier 10 are mounted on and fixed to the racks 6b attached onto the partition wall 6a. A line filter 24 is connected between a microphone 22 and a speaker 23, which are used for communication with a patient as the object to be inspected, and this line filter 24 is also attached onto the partition wall 6a.

In a case of the embodiment shown by FIG. 5 and FIGS. 6A, 6B, since the gradient magnetic field power supply 8 is connected to the partition wall 6a through the case with low impedance, any noise voltage mixed in the received signal can be minimized. Similarly, the radio frequency noise generated from the signal amplifier 9 and the electric power amplifier 10 can be also minimized. In addition, by separating the noise source of the gradient magnetic field power supply 8 from the signal amplifier 9 and the electric power amplifier 10 in this embodiment, the mixing of noise into the signal amplifying system can be further reduced.

Although, in the above embodiment, a description is not made of the power supply system to the line filter units, the gradient magnetic field power supply, the electric power amplifier, the signal amplifier and the other constitutional units, primary commercial electric power may be directly supplied to each of these units. When the nuclear magnetic resonance diagnosis apparatus has a power distributor for supplying electric power to each of the units, electric power may be supplied through the power distributor.

Preferably, the gradient magnetic field power supply 8 and the line noise filter 7a are so connected as to shorten the connecting line between the gradient magnetic field power supply 8 and the line noise filter 7a to reduce the distance therebetween. Typically, such connection can be realized by completely integrating the gradient magnetic field power supply 8 and the line noise filter 7a. Similarly, the electric power supply 21 for the preamplifier 20 and the line noise filter 7b are so connected as to shorten the connecting line between the electric power supply 21 and line noise filter 7b to reduce the distance therebetween. Typically, this condition also can be realized by completely integrating the electric power supply 21 and the line noise filter 7b.

According to the present invention, at least the following effects can be expected.

1. By mounting both the gradient magnetic field power supply and the filter box (a box for containing the line filter) in the cabinet to form an integrated structure, and by attaching the cabinet to the wall surface of the shield room, it is possible to minimize the radio frequency noise generated by the apparatus itself from mixing into the signal receiving system, and to obtain a high quality image having a high signal-nose ratio without false image.

2. Effects of radio frequency noises on the nuclear magnetic resonance diagnosis apparatus can be removed without affecting the output response characteristic of the gradient magnetic field power supply and desired electric power.

3. A high quality image without noise can be stably obtained regardless of the installation environment of the apparatus.

4. By mounting the gradient magnetic field power supply, the signal amplifier, the electric power amplifier (the radio frequency amplifier), the line filter and so on to form one unit, the configuration of the units can be simplified. That is, the number of cabinets can be reduced and number of the cables between the units can be reduced. Accordingly, it is possible to reduce the cost of manufacture and the amount of materials which are required.

What is claimed is:

1. A nuclear magnetic resonance diagnosis apparatus comprising:

a measurement system including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected;

a gradient magnetic field power supply for driving the gradient magnetic field coil;

a signal processing system for reconstructing a sectional image of the object to be inspected based on the nuclear magnetic resonance signal;

an electromagnetic shield room having an electrically conductive shield in which the measurement system is arranged;

a line noise filter for the gradient magnetic field connected between the gradient magnetic field coil and the gradient magnetic power supply; and a cabinet in which the gradient magnetic field power supply and the line noise filter are contained, the cabinet being mechanically and electrically connected to the electrically conductive shield of the shield room.

2. A nuclear magnetic resonance diagnosis apparatus according to claim 1, which further comprises a radio frequency amplifier for supplying a current to the irradiation coil; a signal amplifier for amplifying the nuclear magnetic resonance signal; and another cabinet in which the radio frequency amplifier and said signal amplifier are contained, the another cabinet being electrically connected to the electrically conductive shield of the shield room.

3. A nuclear magnetic resonance diagnosis apparatus according to claim 1, wherein the first cabinet is mechanically connected to the shield room.

4. A nuclear magnetic resonance diagnosis apparatus according to claim 2, wherein the first and second cabinets are mechanically connected to the shield room.

5. A nuclear magnetic resonance diagnosis apparatus according to claim 2, wherein the gradient magnetic field power supply, the line noise filter, the radio frequency amplifier and the signal amplifier are contained in a cabinet formed by integrating the first cabinet and the second cabinet.

6. A nuclear magnetic resonance diagnosis apparatus according to claim 2, which further comprises a preamplifier connected between the receiving coil and the signal amplifier; an electric power supply for the preamplifier; and a line noise filter connected between the preamplifier and the electric power supply for the preamplifier, the electric power supply for the preamplifier and the line filter being contained in the second cabinet.

7. A nuclear magnetic resonance diagnosis apparatus comprising:
- a measurement system including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected;
- a gradient magnetic field power supply for driving the gradient magnetic field coil;
- a radio frequency amplifier for supplying a current to the irradiation coil;
- a signal amplifier for amplifying the nuclear magnetic resonance signal;
- a preamplifier connected between the receiving coil and the signal amplifier;
- an electric power supply for the preamplifier;
- a signal processing system for reconstructing a sectional image of the object to be inspected based on the nuclear magnetic resonance signal;
- an electromagnetic shield room having an electrically conductive shield in which the measurement system is arranged;
- a line noise filter for the gradient magnetic field connected between the gradient magnetic field coil and the gradient magnetic field power supply; and
- a line noise filter for the preamplifier connected between the preamplifier and the electric power supply therefor;
- a first cabinet in which the gradient magnetic field power supply and the line noise filter for the gradient magnetic field are contained, the first cabinet being electrically connected to the electrically conductive shield of the shield room; and
- a second cabinet in which the radio frequency amplifier, the signal amplifier, the preamplifier and the line noise filter therefor are contained, the second cabinet being electrically connected to the electrically conductive shield of the shield room;
- the gradient magnetic field power supply and the line noise filter for the gradient magnetic field being connected to each other so as to reduce the distance therebetween, and/or the preamplifier and the electric power supply for the preamplifier being connected to each other so as to reduce the distance therebetween.

8. A nuclear magnetic resonance diagnosis apparatus according to claim 7, wherein the first and second cabinets are mechanically connected to the shield room.

9. A nuclear magnetic resonance diagnosis apparatus comprising:
- a measurement system including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected;
- a gradient magnetic field power supply for driving the gradient magnetic field coil;
- a radio frequency amplifier for supplying a current to the irradiation coil;
- a signal amplifier for amplifying the nuclear magnetic resonance signal;
- a preamplifier connected between the receiving coil and the signal amplifier;
- an electric power supply for the preamplifier;
- a signal processing system for reconstructing a sectional image of the object to be inspected based on the nuclear magnetic resonance signal;
- an electromagnetic shield room having an electrically conductive shield in which the measurement system is arranged;
- a line noise filter for the gradient magnetic field connected between the gradient magnetic field coil and the gradient magnetic field power supply;
- a line noise filter for the preamplifier connected between the preamplifier and the electric power supply therefor;
- the gradient magnetic field power supply and the line noise filter for the gradient magnetic field being connected to each other so as to be prevented from being spaced apart from each other, and/or the preamplifier and the electric power supply therefor being connected to each other so as to be prevented from being spaced apart from each other; and
- at least one cabinet which is mechanically and electrically connected to the electrically conductive shield of the shield room, the at least one cabinet containing at least the gradient magnetic field power supply and the line noise filter for the magnetic field therein.

10. A nuclear magnetic resonance diagnosis apparatus comprising:
- a measurement system including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected;
- a gradient magnetic field power supply for driving the gradient magnetic field coil;
- a radio frequency amplifier for supplying a current to the irradiation coil;
- a signal amplifier for amplifying the nuclear magnetic resonance signal;
- a preamplifier connected between the receiving coil and the signal amplifier;
- an electric power supply for the preamplifier;
- a signal processing system for reconstructing a sectional image of the object to be inspected based on the nuclear magnetic resonance signal;
- an electromagnetic shield room having an electrically conductive shield in which the measurement system is arranged;
- a line noise filter for the gradient magnetic field connected between the gradient magnetic field coil and the gradient magnetic field power supply;

a line noise filter for the preamplifier connected between the preamplifier and the electric power supply therefor;

the gradient magnetic field power supply and the line noise filter for the gradient magnetic field being connected to each other so that a connection line therebetween has an impedance of substantially zero, and/or the preamplifier and the electric power supply therefor being connected to each other so that a connection line therebetween has an impedance of substantially zero; and at least one cabinet which is mechanically and electrically connected to the electrically conductive shield of the shield room, the at least one cabinet containing at least the gradient magnetic field power supply and the line noise filter for the magnetic field therein.

11. A nuclear magnetic resonance diagnosis apparatus comprising:

a measurement system including a magnet for generating a static magnetic field in a space in which an object to be inspected is placed, a gradient magnetic field coil for generating a gradient magnetic field in the space, an irradiation coil for applying a radio frequency magnetic field to the object to be inspected and a receiving coil for detecting a nuclear magnetic resonance signal generated from the object to be inspected;

a gradient magnetic field power supply for driving the gradient magnetic field coil;

a radio frequency amplifier for supplying a current to the irradiation coil;

a signal processing system for reconstructing a sectional image of the object to be inspected based on the nuclear magnetic resonance signal;

an electromagnetic shield room having an electrically conductive shield in which the measurement system is arranged;

a line noise filter for the gradient magnetic field connected between the gradient magnetic field coil and the gradient magnetic power supply;

a system ground to which the gradient magnetic field power supply, the signal amplifier, the radio frequency amplifier and the line noise filter are connected; and at least one cabinet which is mechanically and electrically connected to the electrically conductive shield of the shield room, the at least one cabinet containing at least the gradient magnetic field power supply and the line noise filter for the magnetic field therein.

12. A nuclear magnetic resonance diagnosis apparatus comprising:

a measurement system including a magnet for generating a static magnetic field in a space in which an object to be inspected is placed, a gradient magnetic field coil for generating a gradient magnetic field in the space, an irradiation coil for applying a radio frequency magnetic field to the object to be inspected and a add receiving coil for detecting a nuclear magnetic resonance signal generated from the object to be inspected;

a gradient magnetic field power supply for driving the gradient magnetic field coil;

a signal processing system for reconstructing a sectional image of the object to be inspected based on the nuclear magnetic resonance signal;

an electromagnetic shield room having an electrically conductive shield in which the measurement system is arranged;

a line noise filter connected between the gradient magnetic field coil and the gradient magnetic power supply;

the gradient magnetic field power supply and the line noise filter being connected to each other so that a noise voltage generated from the gradient magnetic field power supply and mixed in the nuclear magnetic resonance signal is substantially zero; and at least one cabinet which is mechanically and electrically connected to the electrically conductive shield of the shield room, the at least one cabinet containing at least the gradient magnetic field power supply and the line noise filter for the magnetic field therein.

13. A nuclear magnetic resonance diagnosis apparatus according to claim 12, which further comprises a radio frequency amplifier for supplying a current to the irradiation coil and a signal amplifier for amplifying the nuclear magnetic resonance signal, the irradiation coil and the radio frequency amplifier being connected to each other so that a noise voltage generated from the radio frequency amplifier and mixed in the nuclear magnetic resonance signal becomes substantially zero, and the receiving coil and the signal amplifier being connected to each other so that a noise voltage generated from the signal amplifier and mixed in the nuclear magnetic resonance signal becomes substantially zero.

14. A magnetic resonance diagnosis apparatus comprising:

a shield room for shielding radio frequency noises, the shield room having a surface made of an electrically conductive material;

a cabinet shielding the radio frequency noises;

a measurement system arranged in the shield room, the measurement system including a static magnetic field generating means for applying a static magnetic field to an object to be inspected which is place therein, gradient magnetic field generating means for generating a gradient magnetic field in the static magnetic field, radio frequency magnetic field generating means for applying a radio frequency magnetic field to the object to be inspected, and receiving means for detecting a nuclear magnetic resonance signal generated from the object to be inspected; and signal processing means for reconstructing a sectional image of the object to be inspected on the basis of the detected nuclear magnetic resonance signal;

wherein the cabinet is electrically connected to the electrically conductive material of the shield room.

15. A nuclear magnetic resonance diagnosis apparatus according to claim 14, wherein the cabinet is mechanically connected to the shield room.

16. A magnetic resonance diagnosis apparatus according to claim 14, wherein a portion of the cabinet projects inside the shield room.

17. A magnetic resonance diagnosis apparatus according to claim 14, further comprising means for supplying electricity to the measurement system, the cabinet being provided with line noise removing means for removing noises generated from the electricity supplying means and a line noise filter unit for accommodating the line noise removing means, the shield room being electrically connected to the cabinet through the line noise filter unit and the electrically conductive material of the shield room.

18. A nuclear magnetic resonance diagnosis apparatus according to claim 17, wherein the shield room is mechanically connected to the cabinet.

19. A magnetic resonance diagnosis apparatus according to claim 17, wherein the cabinet is provided with a gradient magnetic field power supply, the gradient magnetic field power supply being connected to the gradient magnetic field generating means through the line noise filter unit and the line noise removing means.

20. A magnetic resonance diagnosis apparatus according to claim 17, wherein the cabinet is provided with an electric power amplifier, the electric power amplifier being connected to the radio frequency magnetic field generating means through the line noise filter unit and the line noise removing means.

21. A magnetic resonance diagnosis apparatus according to claim 17, wherein the cabinet is provided with a signal amplifier, the signal amplifier being connected to the receiving means through the line filter unit and the line noise removing means.

22. A magnetic resonance diagnosis apparatus according to claim 20, wherein the cabinet is provided with a pre-amplifier connected between the receiving means and the signal amplifier, and the pre-amplifier is connected to an electric power supply for the pre-amplifier through the line noise filter unit and the line noise removing means.

23. A magnetic resonance diagnosis apparatus according to claim 19 or 20, wherein at least one of the gradient magnetic field power supply and the line noise removing means are connected to each other so as to be prevented from being spaced apart from each other and the electric power supply for the pre-amplifier are connected to each other so as to be prevented from being spaced apart from each other.

24. A magnetic resonance diagnosis apparatus according to claim 19 or 22, wherein at least one of the gradient magnetic field power supply and the line noise removing means are integrated with each other and the electric power supply for the pre-amplifier and the line noise removing means are integrated with each other.

25. A magnetic resonance diagnosis apparatus according to claim 20 or 21, wherein at least one of the line noise filter unit and the radio frequency amplifier are connected to each other so as to be prevented from being spaced apart from each other and the signal amplifier and the line noise filter unit are connected to each other so as to be prevented from being spaced apart from each other.

26. A magnetic resonance diagnosis apparatus according to claim 19, further comprising a system ground for grounding the gradient magnetic field power supply, the line noise removing means and the cabinet at a common point.

27. A magnetic resonance diagnosis apparatus according to claim 20, further comprising a system ground for grounding the line noise removing filter, the radio frequency amplifier and the cabinet at a common point.

28. A magnetic resonance diagnosis apparatus according to claim 21, further comprising a system ground for grounding the line noise removing means, the signal amplifier and the cabinet at a common point.

29. A magnetic resonance diagnosis apparatus according to claim 22, further comprising a system ground for grounding line noise removing means, the electric power supply for the pre-amplifier and the cabinet at a common point.

30. A magnetic resonance diagnosis apparatus according to claim 26, wherein an electric circuit is formed by connecting the gradient magnetic field power supply, the line noise removing means and the cabinet.

31. A magnetic resonance diagnosis apparatus according to claim 28, wherein the gradient magnetic field power supply is connected to the gradient magnetic field generating means through the line noise filter, the gradient magnetic field generating means is connected to the signal amplifier through the radio frequency magnetic field generating means or the receiving means, and the signal amplifier is connected to the gradient magnetic field power supply through the system ground, whereby an electric circuit is formed.

32. A magnetic resonance diagnosis apparatus according to claim 28, wherein the gradient magnetic field power supply is connected to the cabinet through the line noise removing means, and the cabinet is connected to the gradient magnetic field power supply through the system ground, whereby an electric circuit is formed.

33. A magnetic resonance diagnosis apparatus according to claim 14, wherein at least two cabinets are provided and are electrically connected to the electrically conductive material of the shield room.

34. A nuclear magnetic resonance diagnosis apparatus according to claim 33, wherein the at least two cabinets are mechanically connected to the shield room.

35. A magnetic resonance diagnosis apparatus according to claim 33, wherein a first cabinet of the at least two cabinets accommodates a line noise filter unit and a gradient magnetic field power supply, and a second cabinet of the at least two cabinets accommodates a radio frequency amplifier and a signal amplifier, the first and second cabinets being electrically connected to the electrically conductive material of the shield room.

36. A nuclear magnetic resonance diagnosis apparatus according to claim 35, wherein the at least two cabinets are mechanically connected to the shield room.

37. A magnetic resonance diagnosis apparatus according to claim 14, wherein the cabinet comprises a portion of a wall of the shield room.

38. A magnetic resonance diagnosis apparatus according to claim 14, which further comprises means for supplying electricity to the measurement system, the cabinet comprising line noise removing means for removing noises generated from the electricity supplying means and a line noise filter unit for accommodating the line noise removing means so that a noise removing circuit is formed using the shield room and the cabinet.

39. A magnetic resonance diagnosis apparatus comprising:
   a shield room for shielding radio frequency noises, the shield room having a surface made of an electrically conductive material;
   a cabinet shielding the radio frequency noises;
   a measurement system arranged in the shield room, the measurement system including a static magnetic field generating means-for applying a static magnetic field to an object to be inspected which is place therein, gradient magnetic field generating means for generating a gradient magnetic field in the static magnetic field, radio frequency magnetic field generating means for applying a radio frequency magnetic field to the object to be inspected, and receiving means for detecting a nuclear magnetic resonance signal generated from the object to be inspected; and
   signal processing means for reconstructing a sectional image of the object to be inspected on the basis of the detected nuclear magnetic resonance signal;
   wherein the cabinet is arranged inside the shield room and electrically connected to the electrically conductive material of the shield room.

40. A magnetic resonance diagnosis apparatus comprising:
   a shield room for shielding radio frequency noises, the shield room having a surface made of an electrically conductive material;

a cabinet shielding the radio frequency noises;

a measurement system arranged in the shield room, the measurement system including a static magnetic field generating means for applying a static magnetic field to an object to be inspected which is place therein, gradient magnetic field generating means for generating a gradient magnetic field in the static magnetic field, radio frequency magnetic field generating means for applying a radio frequency magnetic field to the object to be inspected, and receiving means for detecting a nuclear magnetic resonance signal generated from the object to be inspected; and signal processing means for reconstructing a sectional image of the object to be inspected on the basis of the detected nuclear magnetic resonance signal;

wherein the cabinet is electrically connected to the electrically conductive material of the shield room, and a portion of the cabinet is arranged inside the shield room.

41. A magnetic resonance diagnosis apparatus comprising:

a shield room for shielding radio frequency noises, the shield room having a surface made of an electrically conductive material;

a cabinet shielding the radio frequency noises;

a measurement system arranged in the shield room, the measurement system including a static magnetic field generating means for applying a static magnetic field to an object to be inspected which is place therein, gradient magnetic field generating means for generating a gradient magnetic field in the static magnetic field, radio frequency magnetic field generating means for applying a radio frequency magnetic field to the object to be inspected, and receiving means for detecting a nuclear magnetic resonance signal generated from the object to be inspected; and signal processing means for reconstructing a sectional image of the object to be inspected on the basis of the detected nuclear magnetic resonance signal;

wherein a portion of the cabinet is electrically connected to the electrically conductive material of the shield room with surface contact.

* * * * *